United States Patent
Yu et al.

(10) Patent No.: US 10,103,146 B2
(45) Date of Patent: Oct. 16, 2018

(54) FINFET DEVICE WITH EPITAXIAL STRUCTURES THAT WRAP AROUND THE FINS AND THE METHOD OF FABRICATING THE SAME

(71) Applicant: Taiwan Semiconductor Manufacturing Co., Ltd., Hsinchu (TW)

(72) Inventors: Chia-Ta Yu, Taipei (TW); Sheng-Chen Wang, Hsinchu (TW); Cheng-Yu Yang, Changhua County (TW); Kai-Hsuan Lee, Hsinchu (TW); Sai-Hooi Yeong, Hsinchu County (TW); Feng-Cheng Yang, Hsinchu County (TW); Yen-Ming Chen, Hsinchu County (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 15/838,451

(22) Filed: Dec. 12, 2017

(65) Prior Publication Data

US 2018/0166442 A1    Jun. 14, 2018

Related U.S. Application Data

(63) Continuation of application No. 15/490,959, filed on Apr. 19, 2017, now Pat. No. 9,865,595.
(Continued)

(51) Int. Cl.
*H01L 21/00* (2006.01)
*H01L 21/8238* (2006.01)
(Continued)

(52) U.S. Cl.
CPC .. *H01L 27/0886* (2013.01); *H01L 21/823418* (2013.01); *H01L 21/823431* (2013.01); *H01L 21/823475* (2013.01); *H01L 29/0847* (2013.01)

(58) Field of Classification Search
CPC ..... H01L 21/823431; H01L 21/823487; H01L 21/823821; H01L 21/823885;
(Continued)

(56) References Cited

U.S. PATENT DOCUMENTS

| 7,425,740 B2 | 9/2008 | Liu et al. |
| 7,667,271 B2 | 2/2010 | Yu et al. |

(Continued)

FOREIGN PATENT DOCUMENTS

| KR | 20140111575 A | 9/2014 |
| KR | 20160011742 A | 2/2016 |

(Continued)

*Primary Examiner* — Hsien Ming Lee
(74) *Attorney, Agent, or Firm* — Haynes and Boone, LLP

(57) ABSTRACT

A FinFET device is provided. The FinFET device includes a plurality of fin structures that protrude upwardly out of a dielectric isolation structure. The FinFET device also includes a plurality of gate structures that partially wrap around the fin structures. The fin structures each extend in a first direction, and the gate structures each extend in a second direction different from the first direction. An epitaxial structure is formed over at least a side surface of each of the fin structures. The epitaxial structure includes: a first epi-layer, a second epi-layer, or a third epi-layer. The epitaxial structure formed over each fin structure is separated from adjacent epitaxial structures by a gap. A silicide layer is formed over each of the epitaxial structures. The silicide layer at least partially fills in the gap. Conductive contacts are formed over the silicide layer.

20 Claims, 14 Drawing Sheets

Related U.S. Application Data

(60) Provisional application No. 62/434,198, filed on Dec. 14, 2016.

(51) Int. Cl.
*H01L 21/336* (2006.01)
*H01L 27/148* (2006.01)
*H01L 29/76* (2006.01)
*H01L 27/088* (2006.01)
*H01L 21/8234* (2006.01)
*H01L 29/08* (2006.01)

(58) Field of Classification Search
CPC ............ H01L 27/0886; H01L 27/0924; H01L 27/10841; H01L 29/785; H01L 29/78642; H01L 29/7926; H01L 29/66795; H01L 29/66545
USPC ........ 257/220, 263, 328, 330, 331; 438/156, 438/173, 192, 212, 268
See application file for complete search history.

(56) References Cited

U.S. PATENT DOCUMENTS

| | | | |
|---|---|---|---|
| 7,910,453 B2 | 3/2011 | Xu et al. |
| 8,048,723 B2 | 11/2011 | Chang et al. |
| 8,053,299 B2 | 11/2011 | Xu |
| 8,183,627 B2 | 5/2012 | Currie |
| 8,362,575 B2 | 1/2013 | Kwok et al. |
| 8,367,498 B2 | 2/2013 | Chang et al. |
| 8,377,779 B1 | 2/2013 | Wang |
| 8,399,931 B2 | 3/2013 | Liaw et al. |
| 8,415,718 B2 | 4/2013 | Xu |
| 8,440,517 B2 | 5/2013 | Lin et al. |
| 8,487,378 B2 | 7/2013 | Goto et al. |
| 8,497,177 B1 | 7/2013 | Chang et al. |
| 8,497,528 B2 | 7/2013 | Lee et al. |
| 8,609,518 B2 | 12/2013 | Wann et al. |
| 8,610,240 B2 | 12/2013 | Lee et al. |
| 8,618,556 B2 | 12/2013 | Wu et al. |
| 8,633,516 B1 | 1/2014 | Wu et al. |
| 8,652,894 B2 | 2/2014 | Lin et al. |
| 8,680,576 B2 | 3/2014 | Ching et al. |
| 8,686,516 B2 | 4/2014 | Chen et al. |
| 8,703,565 B2 | 4/2014 | Chang et al. |
| 8,716,765 B2 | 5/2014 | Wu et al. |
| 8,723,272 B2 | 5/2014 | Liu et al. |
| 8,729,627 B2 | 5/2014 | Cheng et al. |
| 8,729,634 B2 | 5/2014 | Shen et al. |
| 8,735,993 B2 | 5/2014 | Lo et al. |
| 8,736,056 B2 | 5/2014 | Lee et al. |
| 8,742,509 B2 | 6/2014 | Lee et al. |
| 8,772,109 B2 | 7/2014 | Colinge |
| 8,776,734 B1 | 7/2014 | Roy et al. |
| 8,785,285 B2 | 7/2014 | Tsai et al. |
| 8,796,666 B1 | 8/2014 | Huang et al. |
| 8,796,759 B2 | 8/2014 | Perng et al. |
| 8,809,139 B2 | 8/2014 | Huang et al. |
| 8,815,712 B2 | 8/2014 | Wan et al. |
| 8,816,444 B2 | 8/2014 | Wann et al. |
| 8,823,065 B2 | 9/2014 | Wang et al. |
| 8,826,213 B1 | 9/2014 | Ho et al. |
| 8,828,823 B2 | 9/2014 | Liu et al. |
| 8,836,016 B2 | 9/2014 | Wu et al. |
| 8,841,701 B2 | 9/2014 | Lin et al. |
| 8,847,293 B2 | 9/2014 | Lee et al. |
| 8,853,025 B2 | 10/2014 | Zhang et al. |
| 8,860,148 B2 | 10/2014 | Hu et al. |
| 8,887,106 B2 | 11/2014 | Ho et al. |
| 9,105,490 B2 | 8/2015 | Wang et al. |
| 9,455,331 B1 * | 9/2016 | Cai ................... H01L 29/6656 |
| 2011/0068407 A1 | 3/2011 | Yeh et al. |
| 2013/0011983 A1 | 1/2013 | Tsai et al. |
| 2013/0134506 A1 * | 5/2013 | Yagishita .......... H01L 29/66545 |
| | | | 257/330 |
| 2013/0285153 A1 | 10/2013 | Lee et al. |
| 2014/0001574 A1 | 1/2014 | Chen et al. |
| 2014/0110755 A1 | 4/2014 | Colinge |
| 2014/0151812 A1 | 6/2014 | Liaw |
| 2014/0183600 A1 | 7/2014 | Huang et al. |
| 2014/0252412 A1 | 9/2014 | Tsai et al. |
| 2014/0264590 A1 | 9/2014 | Yu et al. |
| 2014/0264592 A1 | 9/2014 | Oxland et al. |
| 2014/0282326 A1 | 9/2014 | Chen et al. |
| 2015/0263003 A1 | 9/2015 | Lee et al. |
| 2015/0349069 A1 * | 12/2015 | Xie .................... H01L 29/785 |
| | | | 257/401 |
| 2016/0315119 A1 | 10/2016 | Nakatsuka |
| 2016/0343572 A1 | 11/2016 | Doris et al. |

FOREIGN PATENT DOCUMENTS

| | | |
|---|---|---|
| TW | 201137942 A | 11/2011 |
| TW | 201401508 A | 1/2014 |
| TW | 201607030 A | 2/2016 |

* cited by examiner

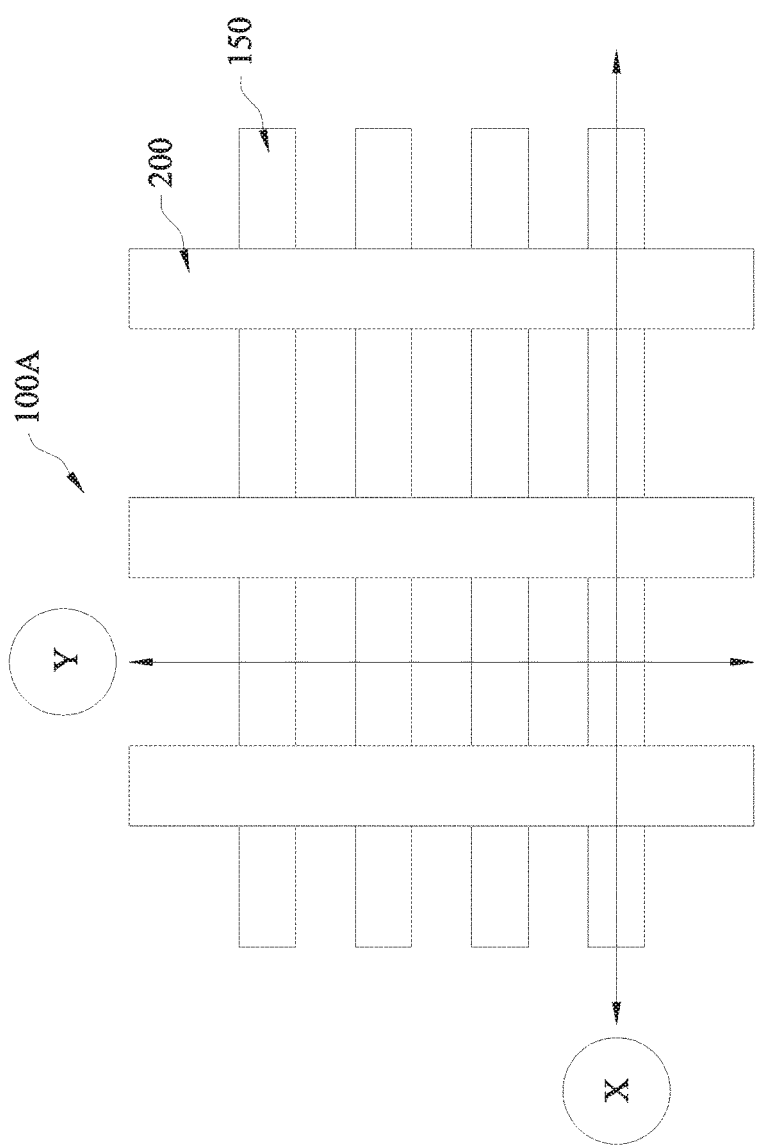

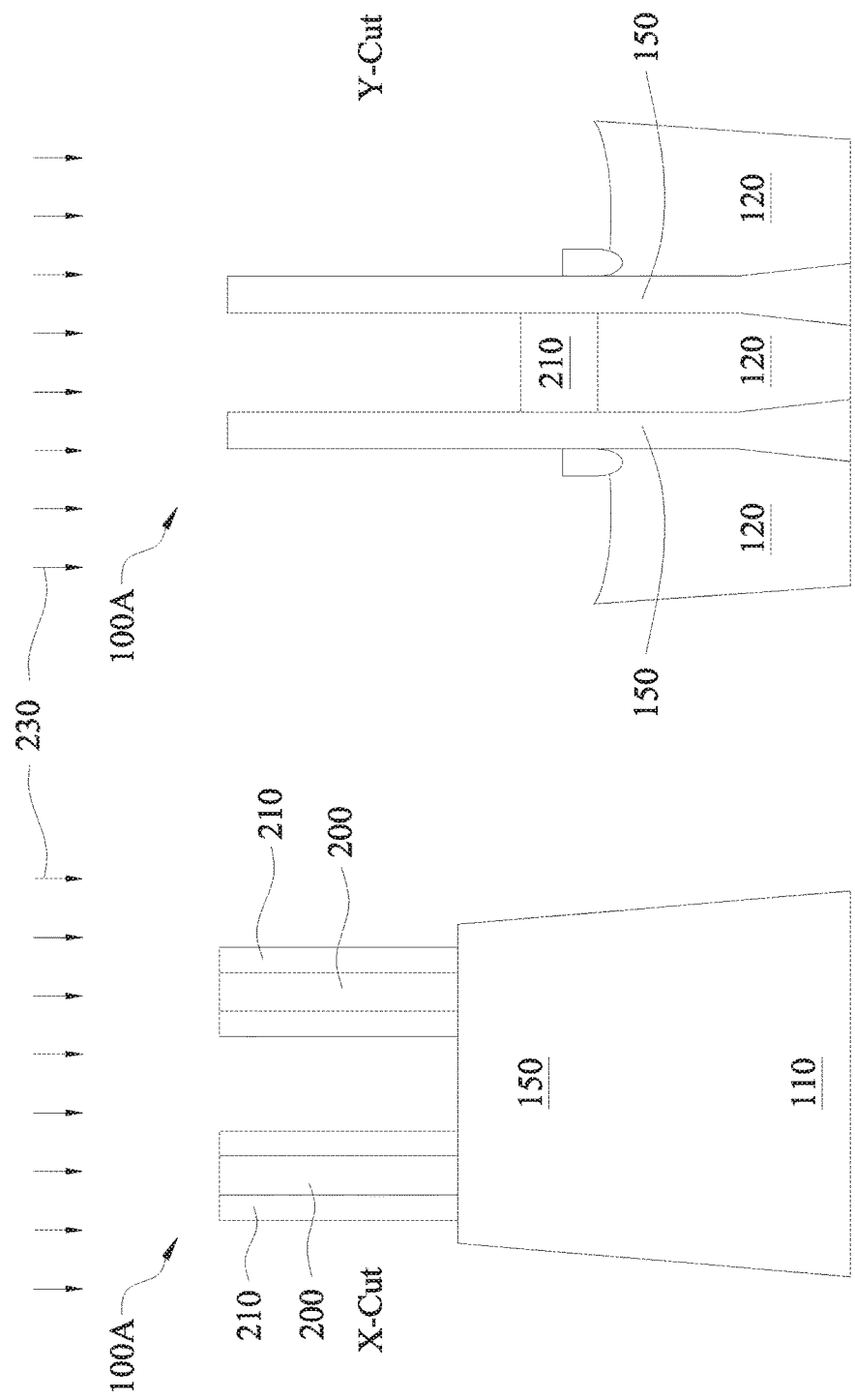

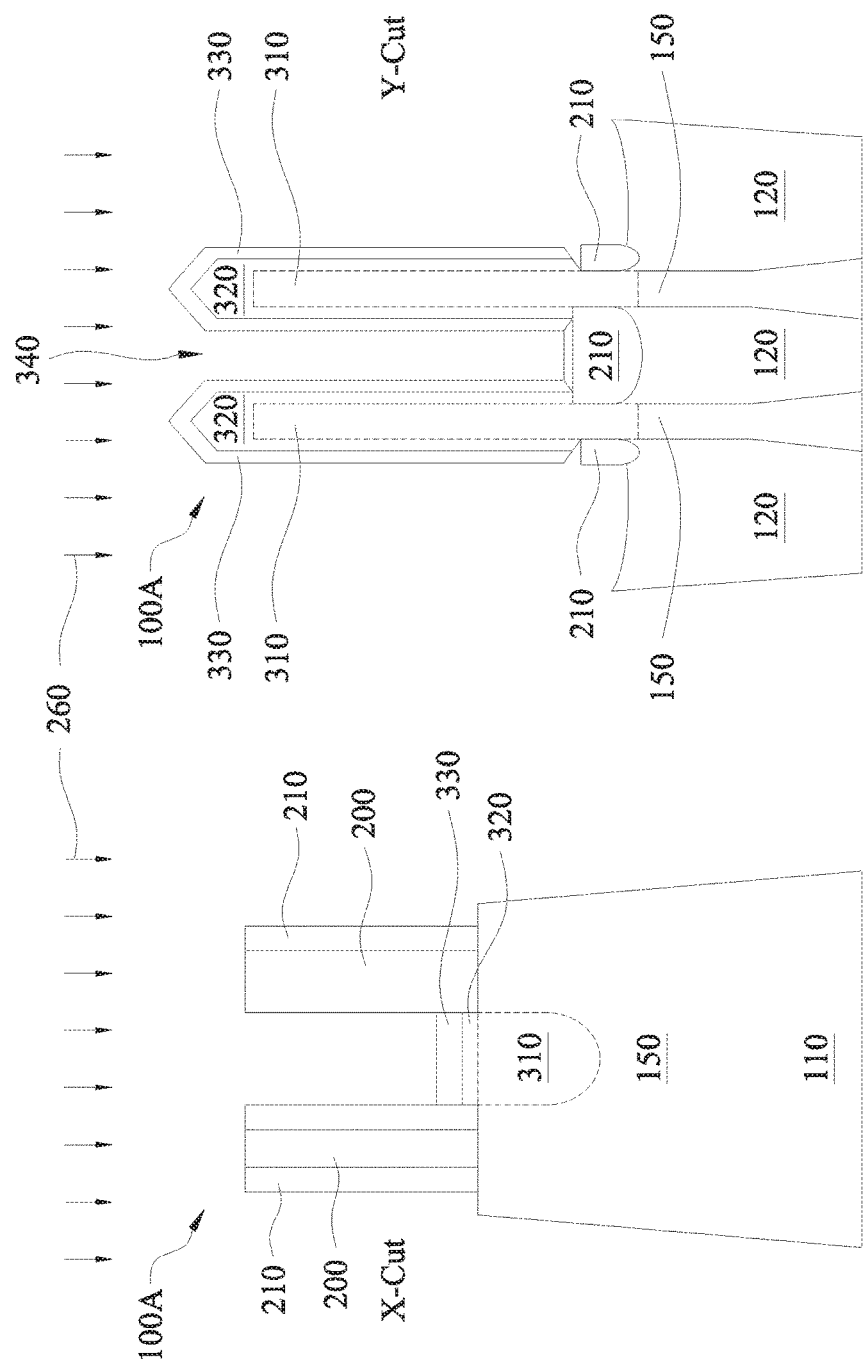

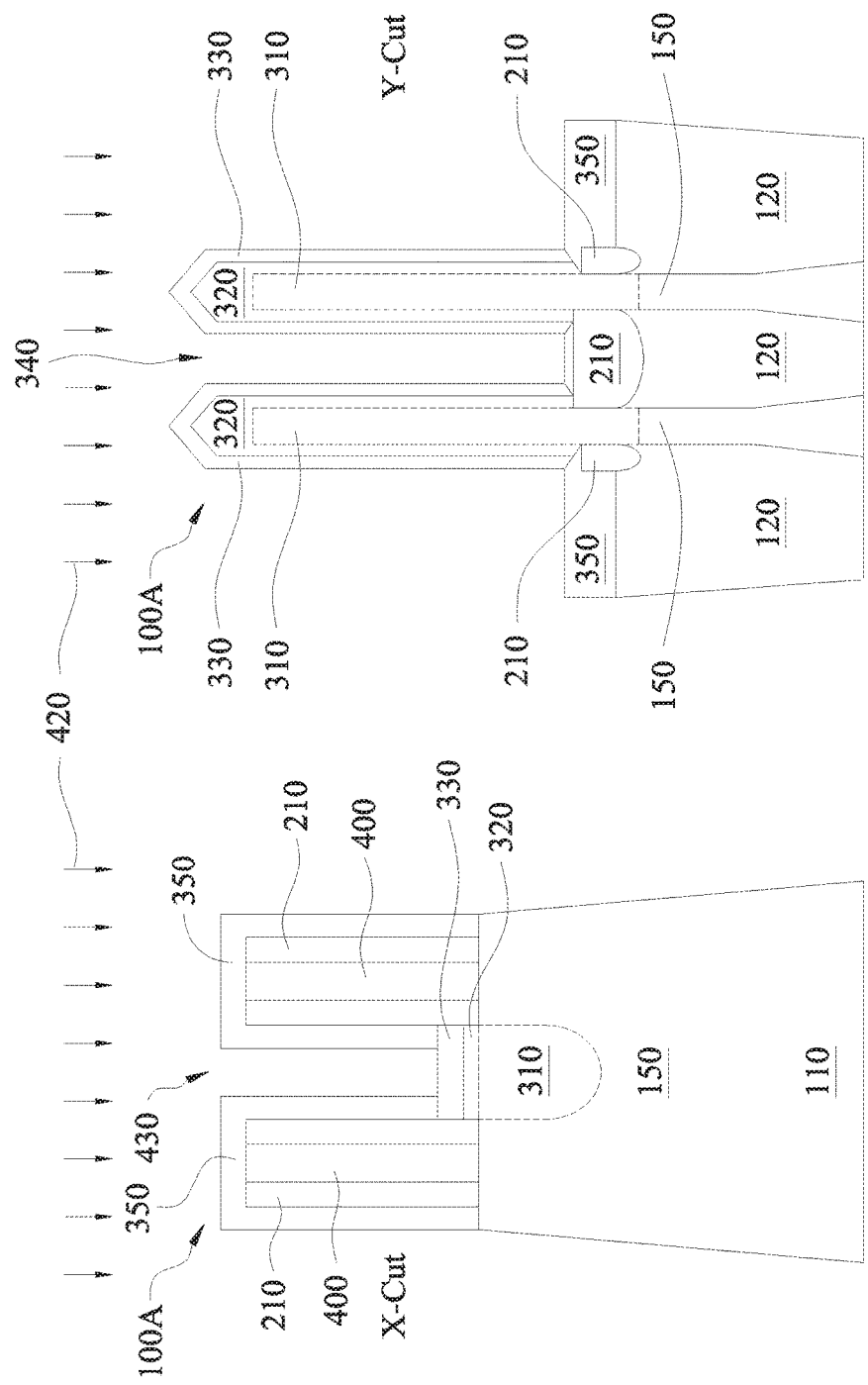

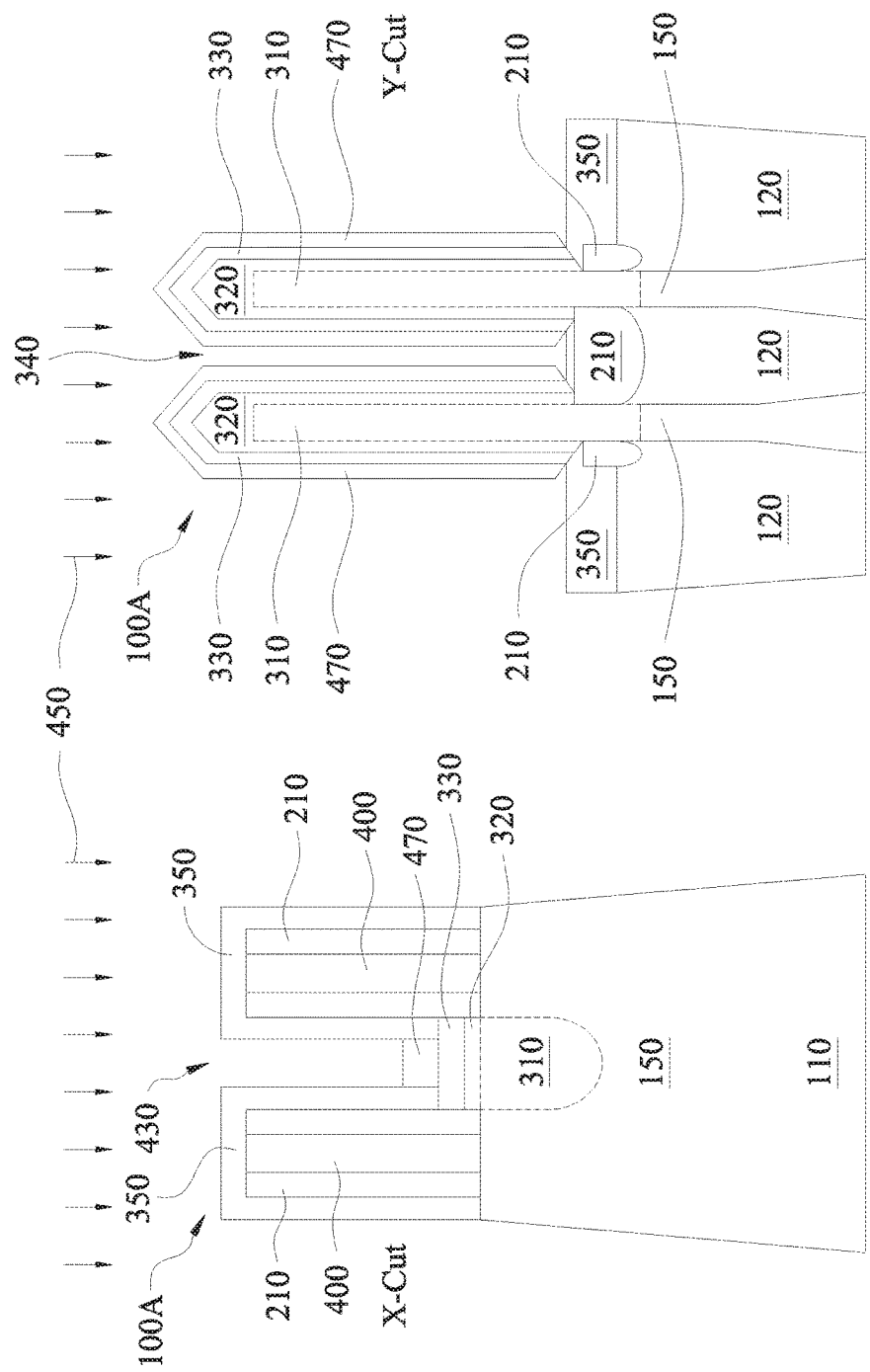

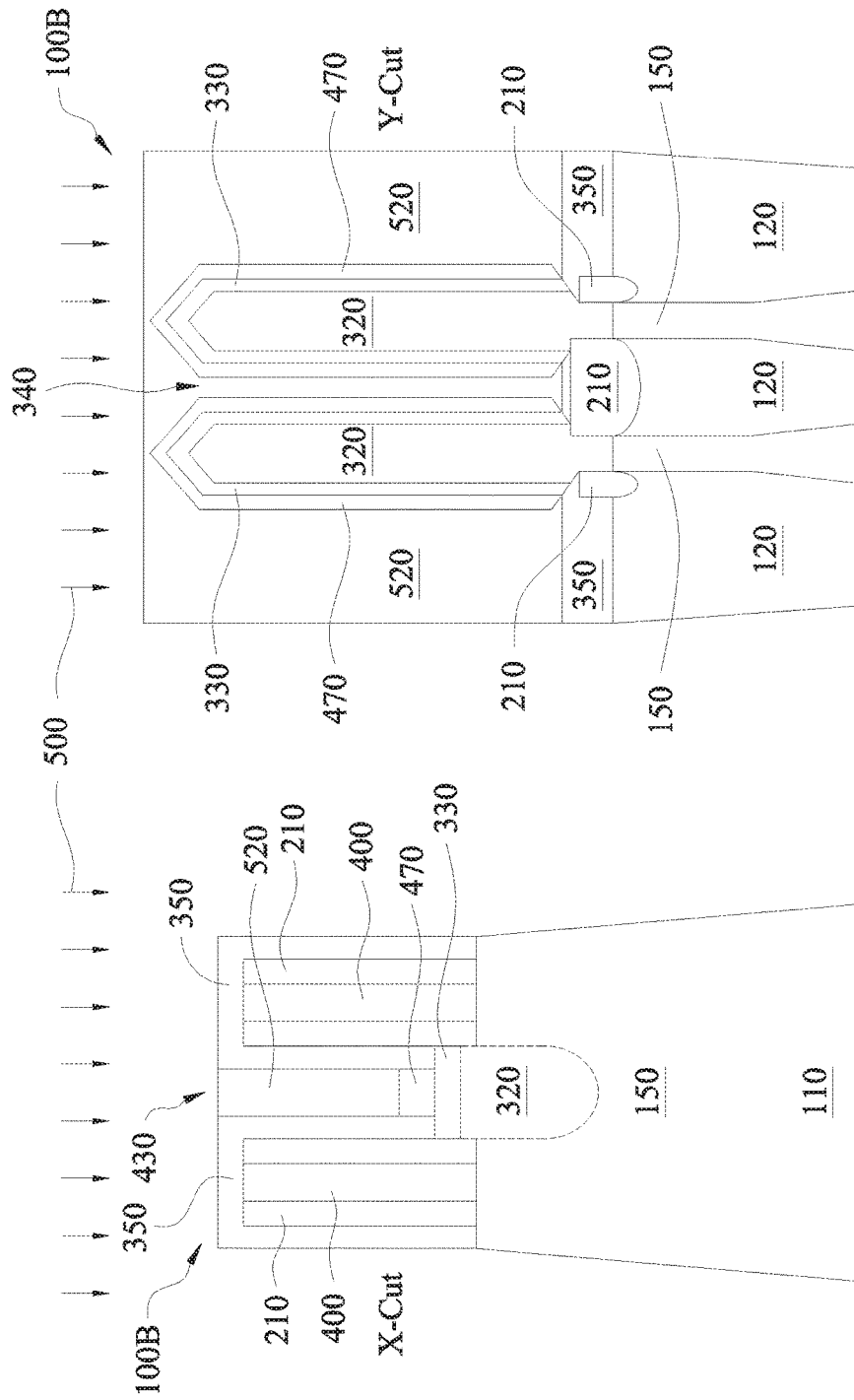

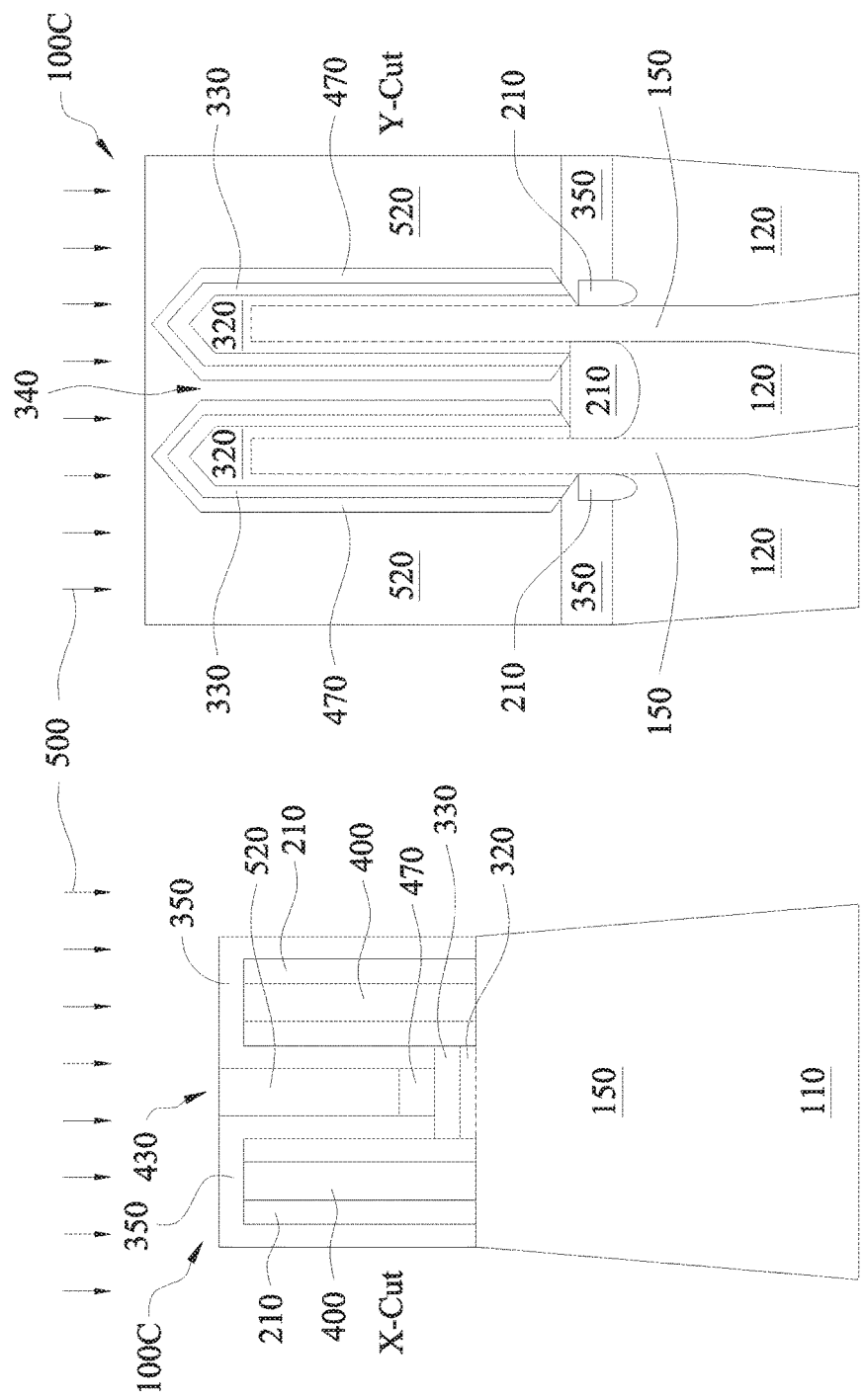

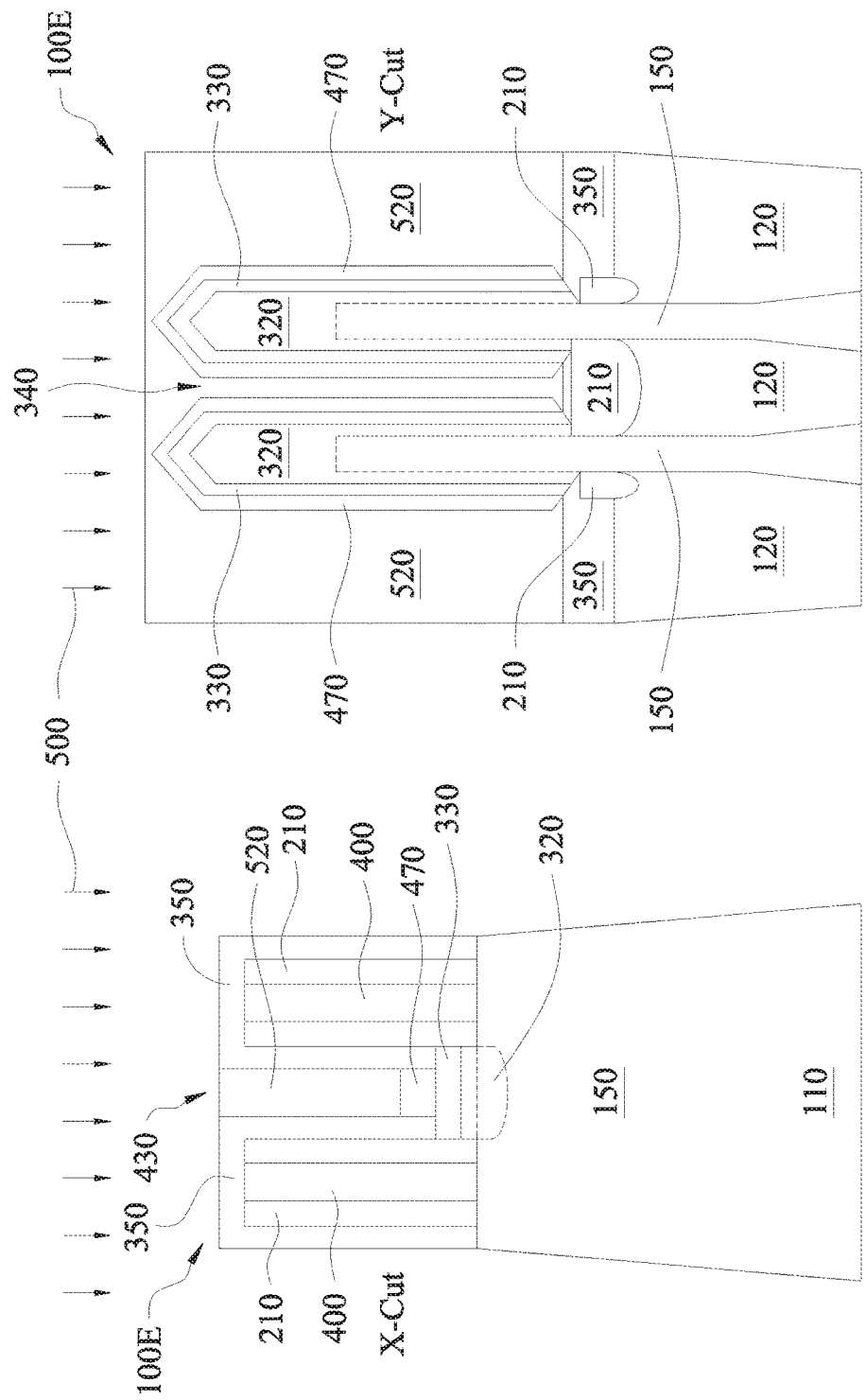

FINFET DEVICE WITH EPITAXIAL STRUCTURES THAT WRAP AROUND THE FINS AND THE METHOD OF FABRICATING THE SAME

CLAIM OF PRIORITY

The present application is a continuation of U.S. patent application Ser. No. 15/490,959, filed Apr. 19, 2017, which is a utility patent application of U.S. Provisional Patent Application No. 62/434,198, filed on Dec. 14, 2016, the disclosures of which are hereby incorporated by reference in their entirety.

BACKGROUND

The semiconductor industry has progressed into nanometer technology process nodes in pursuit of higher device density, higher performance, and lower costs. As this progression takes place, challenges from both fabrication and design issues have resulted in the development of three-dimensional designs, such as fin-like field effect transistor (FinFET) device. A typical FinFET device is fabricated with a thin "fin" (or fin-like structure) extending from a substrate. The fin usually includes silicon and forms the body of the transistor device. The channel of the transistor is formed in this vertical fin. A gate is provided over (e.g., wrapping around) the fin. This type of gate allows greater control of the channel. Other advantages of FinFET devices include reduced short channel effect and higher current flow.

However, conventional FinFET devices may still have certain drawbacks. One drawback is that, conventional FinFET devices may suffer from excessively high contact resistance. The high contact resistance degrades device performance and is therefore undesirable.

Therefore, while existing FinFET devices and the fabrication thereof have been generally adequate for their intended purposes, they have not been entirely satisfactory in every aspect.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIGS. 2A-12A and 2B-12B are different cross-sectional side views of a FinFET device at various stages of fabrication according to various embodiments of the present disclosure.

FIG. 2C is a top view of a FinFET device at a stage of fabrication according to an embodiment of the present disclosure.

DETAILED DESCRIPTION

Figure 1:
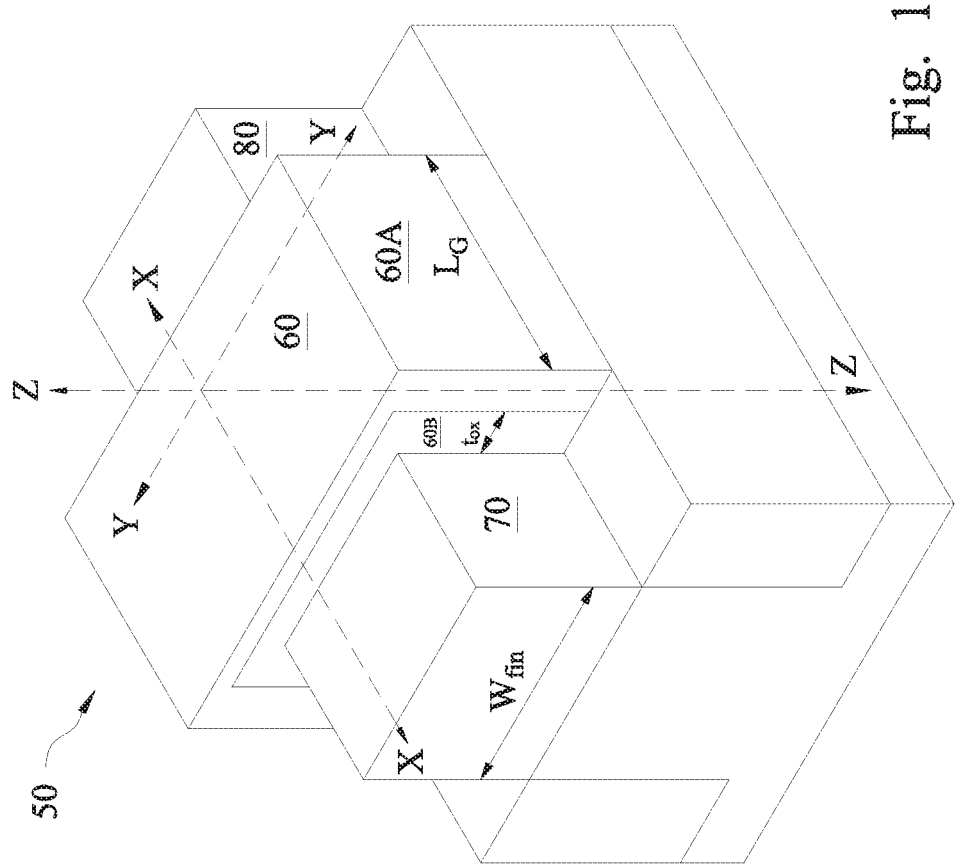
FIG. 1 is a perspective view of an example FinFET device.

It is understood that the following disclosure provides many different embodiments, or examples, for implementing different features of the present disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the sake of simplicity and clarity and does not in itself dictate a relationship between the various embodiments and/or configurations discussed. Moreover, various features may be arbitrarily drawn in different scales for the sake of simplicity and clarity.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. For example, if the device in the figures is turned over, elements described as being "below" or "beneath" other elements or features would then be oriented "above" the other elements or features. Thus, the exemplary term "below" can encompass both an orientation of above and below. The apparatus may be otherwise oriented (rotated 90 degrees or at other orientations) and the spatially relative descriptors used herein may likewise be interpreted accordingly.

The present disclosure is directed to, but not otherwise limited to, a fin-like field-effect transistor (FinFET) device. The FinFET device, for example, may be a complementary metal-oxide-semiconductor (CMOS) device including a P-type metal-oxide-semiconductor (PMOS) FinFET device and an N-type metal-oxide-semiconductor (NMOS) FinFET device. The following disclosure will continue with one or more FinFET examples to illustrate various embodiments of the present disclosure. It is understood, however, that the application should not be limited to a particular type of device, except as specifically claimed.

The use of FinFET devices has been gaining popularity in the semiconductor industry. Referring to FIG. 1, a perspective view of an example FinFET device 50 is illustrated. The FinFET device 50 is a non-planar multi-gate transistor that is built over a substrate (such as a bulk substrate). A thin silicon-containing "fin-like" structure forms the body of the FinFET device 50. The fin has a fin width $W_{fin}$. A gate 60 of the FinFET device 50 is wrapped around this fin. Lg denotes a length (or width, depending on the perspective) of the gate 60. The gate 60 may include a gate electrode component 60A and a gate dielectric component 60B. The gate dielectric 60B has a thickness $t_{ox}$. A portion of the gate 60 is located over a dielectric isolation structure such as shallow trench isolation (STI). A source 70 and a drain 80 of the FinFET device 50 are formed in extensions of the fin on opposite sides of the gate 60. The fin itself serves as a channel. The effective channel length of the FinFET device 50 is determined by the dimensions of the fin.

FinFET devices offer several advantages over traditional Metal-Oxide Semiconductor Field Effect Transistor (MOSFET) devices (also referred to as planar transistor devices). These advantages may include better chip area efficiency, improved carrier mobility, and fabrication processing that is compatible with the fabrication processing of planar devices. Thus, it may be desirable to design an integrated circuit (IC) chip using FinFET devices for a portion of, or the entire IC chip.

However, traditional FinFET fabrication methods may still have shortcomings. For example, conventional FinFET devices typically form an epitaxial layer to serve as its source/drain. The epitaxial layer for one fin may merge into the epitaxial layer for an adjacent fin. As a result, a subsequently-formed silicide layer is formed only on the top surface of the epitaxial layer, rather on the top surface and side surfaces of the epitaxial layer. Since the silicide layer serves as the electrical interface between the epitaxial layer (i.e., source/drain) and a conductive contact to be formed on the silicide layer, the small surface contact area for the silicide layer—which is caused by the merging of the epitaxial layers—increases electrical contact resistance. Excessive electrical contact resistance leads to poor performance of the FinFET device and is therefore undesirable.

To improve device performance, the present disclosure utilizes various fabrication techniques to fabricate FinFET devices with non-merging epitaxial structures. These non-merging epitaxial structures will allow silicide layers to be formed not only on the top surface of the epitaxial structures, but also on the side surfaces of the epitaxial structures. The resulting FinFET device will therefore has reduced electrical contact resistance and improved device performance. The various aspects of the present disclosure are discussed in more detail below with reference to FIGS. 2A-12A, 2B-12B, and 13.

FIGS. 2A-7A illustrate diagrammatic fragmentary cross-sectional side views of a FinFET device 100A at various stages of fabrication according to an embodiment, where the cross-section is taken along the X-direction shown in FIG. 1. FIGS. 2B-7B illustrate diagrammatic fragmentary cross-sectional side views of the FinFET device 100A at the various stages of fabrication corresponding to FIGS. 2A-7A, where the cross-section is taken along the Y-direction shown in FIG. 1. Therefore, FIGS. 1A-7A may be referred to as an "X-cut" of the FinFET device 100A, and FIGS. 1B-7B may be referred to as a "Y-cut" of the FinFET device 100A. FIG. 2C is a top view of the semiconductor device 100A that more clearly illustrates where the X-cut and Y-cut are taken.

The FinFET device 100A is fabricated over a substrate, which is not specifically illustrated herein for reasons of simplicity. In some embodiments, the substrate includes a dielectric material, for example silicon oxide (SiO2). Other suitable materials may also be used for the substrate in alternative embodiments.

The FinFET device 100A includes a semiconductor layer. In an embodiment, the semiconductor layer includes a crystal silicon material. In other embodiments, the semiconductor layer may include silicon germanium. An implantation process (e.g., an anti-punch-through implantation process) may be performed to implant a plurality of dopant ions to the semiconductor layer. The dopant ions may include an n-type material in some embodiments, for example arsenic (As) or phosphorous (P), or they may include a p-type material in some other embodiments, for example boron (B), depending on whether an NMOS or a PMOS is needed. Dielectric isolation structures 120 such as shallow trench isolation (STI) are formed over portions of the semiconductor layer.

Figure 2B:
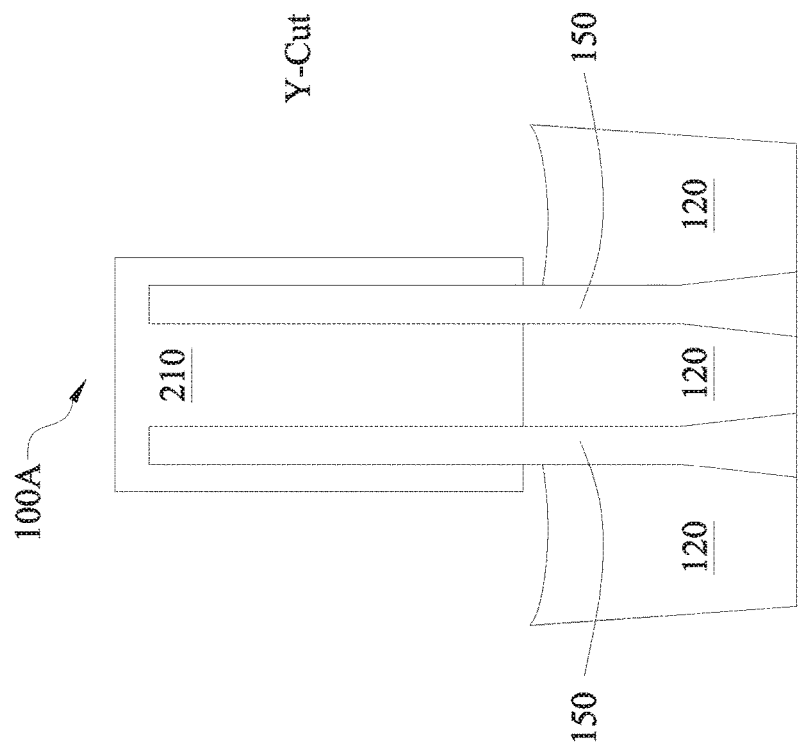
Figure 2A:
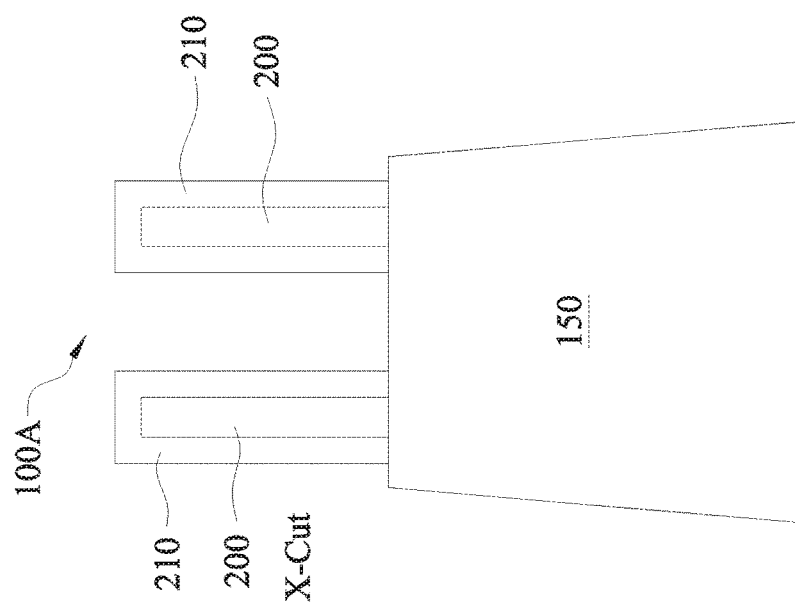

The FinFET device 100A includes fin structures 150. The fin structures 150 are portions of the semiconductor layer that protrude upwardly in the Z-direction. As shown in FIG. 2B, the fin structures 150 protrude upwards and out of the isolation structures 120. In other words, at least a portion of each fin structure 150 is not covered by the isolation structures 120. Also as shown in the top view of FIG. 2C, the fin structures 150 are elongated structures that each extend in the X-direction horizontally.

Referring back to FIG. 2A, gate structures 200 are formed over the fins 150. The gate structures 200 at this stage of fabrication are dummy gate structures. For example, the gate structures 200 may each include a dummy gate electrode that contains a polysilicon material. The gate structures 200 may also include a dummy gate dielectric that contains a silicon oxide material. The dummy gate structures will be replaced by high-k metal gate structures in later fabrication discussed in greater detail below.

Note that the gate structures 200 are not specifically illustrated in FIG. 2B, because the Y-cut of FIG. 2B is taken outside the gate structures 200. This is more clearly illustrated in the top view of FIG. 2C. As is shown in FIG. 2C, the gate structures 200 are elongated structures that each extend in the Y-direction horizontally and "intersect with" the fin structures 150 in the top view. Corresponding to each "intersection" between the gate structures 200 and the fin structures 150, the gate structure 200 actually partially wraps around the fin structure 150, for example in a manner similar to how the gate 60 wraps around the fin that contains the source/drain 70/80 in FIG. 1. That is, a portion of the top and side surfaces of the fin structures 150 are covered by the corresponding gate structures 200. Referring back to FIG. 2C, it can be seen that the Y-cut is taken between two adjacent gate structures 200, rather than on any of the gate structures 200. As such, the gate structure 200 is not visible in the corresponding cross-sectional side view of FIG. 2B.

Spacers 210 are formed on and around the gate structures 200. The spacers 210 may be formed by depositing a dielectric material and patterning the dielectric material. In some embodiments, the spacers 210 contain silicon oxide. In other embodiments, the spacers 210 contain silicon nitride or silicon oxynitride.

It is understood that after the formation of the gate structures 200, the source/drain regions of the FinFET device 100A may be defined, for example photoresist patterning. The source/drain regions may include portions of the fin structures 150 that are not being wrapped around by the gate structures 200, whereas the portions of the fin structures 150 that are being wrapped around by the gate structures serve as the channel components of the FinFET device 100A.

Referring now to FIGS. 3A-3B, an etching process 230 is performed to partially remove the spacers 210. The etching process 230 is configured to have an etching selectivity between the spacers 210 and the fin structures 150 or the gate structures 200. This is done so that the spacers 210 may be etched away without substantially affecting the fin structures 150 or the gate structures 200. The partial removal of the spacers 210 exposes the top surfaces and a substantial majority portion (e.g., over 50%, or over 75%) of the sidewalls of the fin structures 150 (as well as exposing the top surfaces of the gate structures 200).

Referring now to FIGS. 4A-4B, one or more epitaxial growth processes 260 are performed to form epitaxially-grown structures in the FinFET device 100A, where the epitaxially-grown structures include a layer 310, a layer 320, and a layer 330 (hereinafter referred to as epi-layers 310, 320, and 330, respectively). The epi-layers 310, 320, and 330 are silicon-containing materials and may serve as the source/drain of the FinFET device 100A.

In the illustrated embodiment, portions of the fin structures 150 are removed in the source/drain regions of the FinFET device 100A before the epitaxial growth processes 260 are performed. The removal of the fin structures 150 form openings defined by the remaining portions of the spacers 210. The size of the openings defined by the spacers 210 correspond to a lateral dimension of the epi-layer 310. The epi-layer 310 is then epitaxially grown on the fin structures 150 exposed by the openings defined by the spacers 210. In other words, the epi-layer 310 replaces the removed portions of the fin structures 150. In the embodiment illustrated in FIG. 4A, the epi-layer 310 does not extend laterally under the gate spacers 210. However, it is understood that in other embodiments, the epi-layer 310 may be formed to have a lateral extension under the gate spacers 210.

As shown in FIG. 4B, similar to the fin structures 150, the epi-layer 310 protrudes vertically upward (in the Z-direction) out of the openings defined by the spacers 210. Meanwhile, in the X-cut shown in FIG. 4A, it can be seen that the epi-layer 310 is surrounded by the fin structure 150 (and disposed between two adjacent gate structures 200), except for its top/upper surface.

Whereas certain conventional epi-layers may be grown to have a diamond-like cross-sectional shape, the epi-layer 310 is formed to have a more bar-like cross-sectional shape/profile (viewed in the Y-cut). Of course, it is understood that in real world fabrication, the epi-layer 310 may not have perfectly straight or linear edges, but the overall shape is still more similar to a rectangle (though with bumps/dips and/or non-smooth edges) than a diamond. The bar-like shape of the epi-layer allows for better epi-layer uniformity or epi-layer variation in terms of dimensions. In some embodiments, the bar-like cross-sectional shape/profile of the epi-layer 310 is achieved by shrinking the pitch of the gate structures 200. As the pitch shrinks, it causes the resulting epi-layers 310 between two adjacent gate structures to merge into each other, assuming the deposition time for the epi-layer formation is sufficiently long. The merged epi-layer 310 will then exhibit the bar-like cross-sectional shape/profile.

The epi-layer 320 is epitaxially grown on the layer 310, covering the top and sidewall surfaces of the epi-layer 310. In some embodiments, the growth of the epi-layer 320 on the epi-layer 310 is conformal. For example, the epi-layer 320 is grown with a relatively uniform layer thickness all around.

Due to the presence of the remaining spacers 210, the epi-layer 320 is not formed on some bottom portions of the epi-layer 310 (i.e., not on the bottom sidewall surfaces of the epi-layer 310 covered up by the spacers 210). The epi-layer 330 is then epitaxially grown on the epi-layer 320, also covering the top and side surfaces of the epi-layer 320. In some embodiments, the growth of the epi-layer 330 on the epi-layer 320 is also conformal. For example, the epi-layer 330 is grown with a relatively uniform layer thickness all around. The relatively uniform thickness for the epi-layers 320 and 330 may lead to better device performance.

As shown in FIG. 4B, the growth of the epi-layers 310-330 is configured (e.g., by configuring the process parameters of the epi-growth processes 260) such that there is a spacing 340 or gap 340 that separates the outermost epi-layers 330 from adjacent epi-layers 330. In other words, the epitaxial growth processes 260 are performed to ensure that the epi-layers 330 do not merge into adjacent epi-layers 330. This is done to allow for a silicide layer (to be formed later in a fabrication process discussed below) to be formed in a manner such that it "wraps around" the epi-layer 330, for example wrapping around the sidewall surfaces of the epi-layer 330. Had the epi-layers 330 been formed to merge into adjacent epi-layers 330, the wrap-around structure of the silicide layer would not have been possible. This aspect of the present disclosure will be discussed in greater detail below.

It is understood that the epi-layers 310, 320, and 330 may have different material compositions, for example they may each be a silicon germanium (SiGe) layer but with different germanium content or concentration. In some embodiments, the epi-layer 320 has a germanium content/concentration that is greater than the germanium content/concentration of the epi-layers 310 and 330. For example, in some embodiments, the germanium content/concentration of the epi-layer 310 is in a range between 20%-25%, the germanium content/concentration of the epi-layer 320 is greater than 50%, and the germanium content/concentration of the epi-layer 330 is less than 30%. In some other embodiments, the suitable material for the epi-layers 310/320/330 may include a III-V compound. For example, the epi-layer 310 may include GaAs, the epi-layer 320 may include InGaAs with an In (indium) content ranging between about 20% to about 30%, and the epi-layer 330 may include InGaAs with an In content ranging between about 40% to about 60%. By increasing the In content, a lower contact resistance (Rc) can be achieved (for example for NMOS). However, this will also contribute to a lattice constant mismatch with the silicon substrate. Therefore, the epi-layer 310 and epi-layer 320 may serve as buffer layers to reduce the lattice mismatch.

Referring now to FIGS. 5A-5B, an interlayer-dielectric (ILD) 350 is formed. In some embodiments, the ILD 350 contains silicon oxide. The ILD 350 may be formed by a suitable deposition process followed by a polishing process such as chemical-mechanical-polishing (CMP), so as to planarize the upper surface of the ILD 350. The gate structures 200 are then replaced by functional gate structures 400. In some embodiments, the functional gate structures 400 include a high-k gate dielectric and a metal gate electrode. A high-k dielectric material is a material having a dielectric constant that is greater than a dielectric constant of $SiO_2$, which is approximately 4. In an embodiment, the high-k gate dielectric includes hafnium oxide ($HfO_2$), which has a dielectric constant that is in a range from approximately 18 to approximately 40. In alternative embodiments, the high-k gate dielectric may include $ZrO_2$, $Y_2O_3$, $La_2O_5$, $Gd_2O_5$, $TiO_2$, $Ta_2O_5$, HfErO, HfLaO, HfYO, HfGdO, HfAlO, HfZrO, HfTiO, HfTaO, or SrTiO.

The metal gate electrode may include a work function metal component and a fill metal component. The work functional metal component is configured to tune a work function of its corresponding FinFET to achieve a desired threshold voltage Vt. In various embodiments, the work function metal component may contain: TiAl, TiAlN, TaCN, TiN, WN, or W, or combinations thereof. The fill metal component is configured to serve as the main conductive portion of the functional gate structure 400. In various embodiments, the fill metal component may contain Aluminum (Al), Tungsten (W), Copper (Cu), or combinations thereof.

Also as shown in FIG. 5A, an etching process 420 is performed to etch an opening 430 in the ILD 350. The opening 430 is vertically (in the Z-direction) aligned with, and exposes, a portion of the epi-layer 330. This opening 430 allows for conductive contacts to be formed therein later, so as to provide electrical connectivity to the epi-layers 310-330.

Referring now to FIGS. 6A-6B, a deposition process 450 is performed to form silicide layers 470 on the epi-layer 330. In some embodiments, the deposition process 450 may deposit a metal material (e.g., titanium or titanium nitride) on the exposed top surfaces as well as the vertical sidewall surfaces of the epi-layer 330, and then causing the deposited metal material to react with the material of the epi-layer 330 (e.g., a silicon-containing material such as SiGe) to form a silicide material, such as titanium silicide. The reaction to form the silicide material may be facilitated by performing an annealing process, such as a rapid thermal annealing (RTA). Since the silicide layers 470 are self-aligned with the epi-layer 330 (i.e., with the source/drain), the silicide layers 470 may also be referred to as salicide layers.

As discussed above with reference to FIG. 4B, the epi-layers 330 are formed in a manner such that the epi-layers 330 do not come into contact with adjacent epi-layers 330, so as to ensure a gap 340 between the adjacent epi-layers 330. This gap 340 allows the silicide layers 470 to be formed on not just the top/upper surfaces of the epi-layers 330, but also on the vertical side surfaces of the epi-layers 330. In other words, the gap 340 enables the silicide layers 470 to wrap around the epi-layers 330 (on at least the top and side surfaces), as is shown in FIG. 6B. It is understood that the silicide layers 470 themselves may still be separated by the gap 340 (though with reduced dimensions) in some embodiments, or they may merge into adjacent silicides layers 470 in other embodiments. It other words, the silicide layers 470 may partially fill in the gap 340 in some embodiments, or they may completely fill in the gap 340 in some other embodiments.

The silicide layers 470 have a low electrical resistivity. Since conductive contacts will be formed in a later process to provide electrical connectivity to the source/drain, the silicide layers 470 reduce the resistance of the conductive contacts. Since the silicide layers 470 wrap around the upper surfaces and sidewall surfaces of the epi-layer 330. This is in contrast to conventional silicide layers where the silicide layer is typically formed only on the top/upper surfaces of the epi-layers serving as source/drain. Thus, through the much bigger surface area (compared to conventional devices), the silicide layers 470 herein offer reduced source/drain contact resistance over conventional devices.

Figures 7A, 7B:
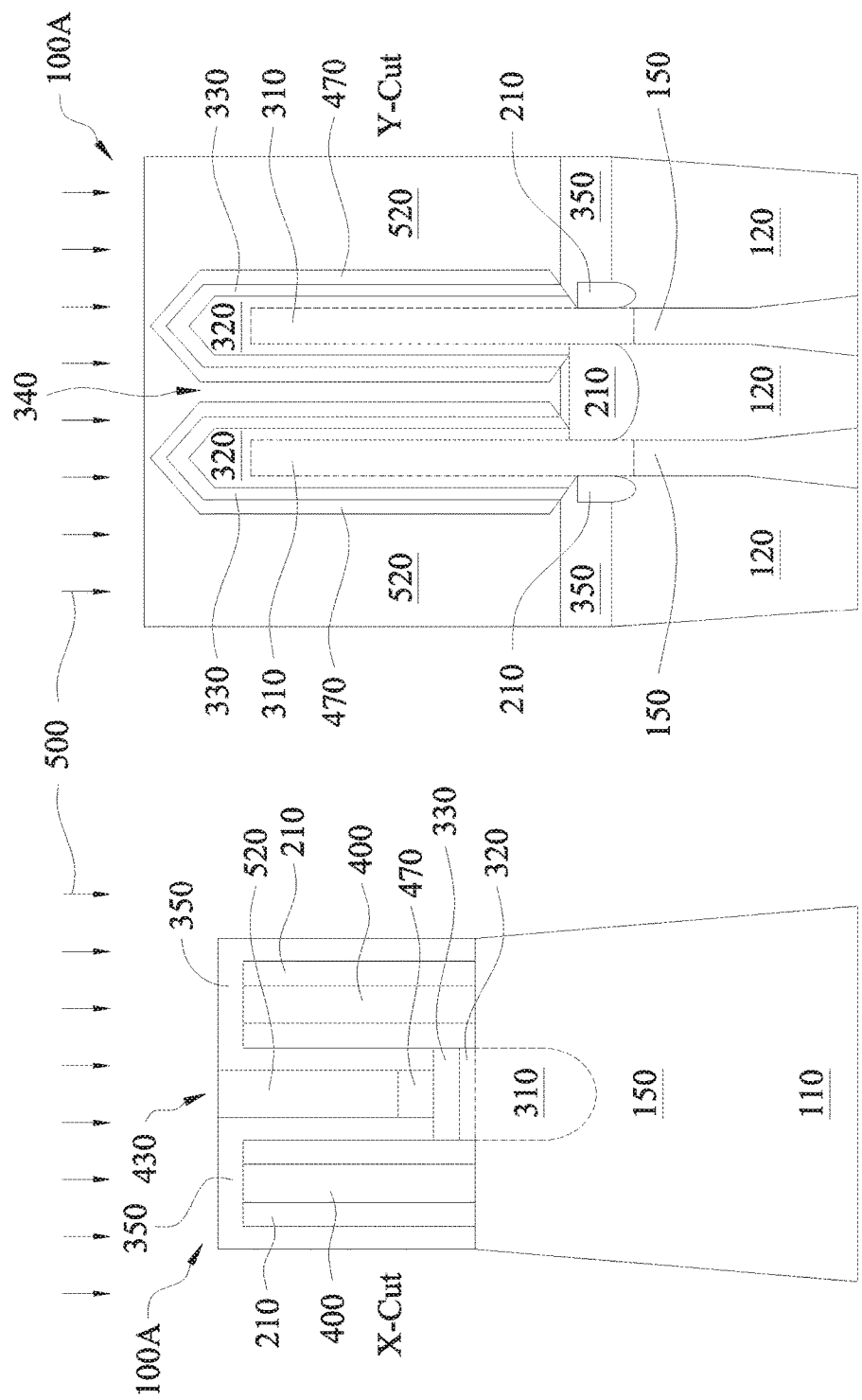

Referring now to FIGS. 7A-7B, a deposition process 500 is performed to form conductive contacts 520. The deposition process 500 may include depositing a metal material such as tungsten (W) on the epi-layer 330. The deposited metal material may then undergo a polishing process such as chemical-mechanical-polishing (CMP) to planarize its upper surface. As is shown in FIG. 7A, the conductive contacts 520 fill the opening 430 and are in direct physical contact with an upper surface of the layer 470. As is shown in FIG. 7B, the conductive contacts 520 are formed to be in direct physical contact with outer surfaces of the silicide layers 470, including the side surfaces of the silicide layers 470. As discussed above, the surface contact area between the silicide layers 470 and the conductive contacts 520 is increased due to the silicide layers 470 wrapping around the source/drain epi-layers. This reduces the contact resistance, in addition to providing more reliable contacts 470.

The above discussions pertain to an embodiment of the FinFET device 100A in which the epitaxial structures formed on adjacent fin structures are not merged into each other, thereby providing an adequate amount of room for the formation of silicide layers on sidewalls of the epitaxial structures. However, the present disclosure is not limited to the embodiment discussed above. FIGS. 8A-12A and 8B-12B and the discussions below describe additional embodiments of the FinFET device. Once again, FIGS. 8A-12A illustrate diagrammatic fragmentary cross-sectional side views of the different embodiments of the FinFET device according to the X-cut (similar to FIGS. 2A-7A), and FIGS. 8B-12B illustrate diagrammatic fragmentary cross-sectional side views of the different embodiments of the FinFET device according to the Y-cut (similar to FIGS. 2B-7B). For reasons of consistency and clarity, similar components/elements appearing in FIGS. 7A-7B will be labeled the same in FIGS. 8A-12A and 8B-12B.

Referring now to FIGS. 8A-8B, an alternative embodiment of the FinFET device 100B is illustrated. Compared to the embodiment of the FinFET device 100A shown in FIGS. 7A-7B, the embodiment shown in FIGS. 8A-8B does not have the first epi-layer 310 as a part of the epitaxial structure. In other words, after removing the fin structures 150 (described above with reference to FIGS. 4A-4B), the formation of the FinFET device 100B involves epitaxially growing the epi-layer 320—and not the epi-layer 310—in place of the removed fin structures 150. Subsequently, the epi-layer 330 is grown on the epi-layer 320, and the silicide layer 470 is formed on the outer surfaces of the epi-layer 330. Accordingly, the embodiment of the FinFET device 100B includes two epi-layers 320/330 as its epitaxial structure, rather than three epi-layers 310/320/330 in the embodiment of the FinFET device 100A. As discussed above, the epi-layer 320 has greater germanium content than the epi-layers 310 and 330. Since the FinFET device 100B now has a much larger epi-layer 320 (due to the epi-layer 310 not being present), the embodiment of the FinFET device 100B shown in FIGS. 8A-8B has improved device performance, for example with respect to the "on" current ($I_{on}$).

Referring now to FIGS. 9A-9B, another embodiment of the FinFET device 100C is illustrated. Compared to the embodiment of the FinFET device 100A shown in FIGS. 7A-7B, the embodiment shown in FIGS. 9A-9B does not replace the fin structures 150 and does not involve forming the epi-layer 310. In more detail, instead of removing the fin structures 150 (as was done for the FinFET 100A, described above with reference to FIGS. 4A-4B), the formation of the FinFET device 100C leaves the fin structures 150 in place. Subsequently, the epi-layer 320 is grown on the fin structures 150, the epi-layer 330 is grown on the epi-layer 320, and the silicide layer 470 is formed on the outer surfaces of the epi-layer 330. Accordingly, the embodiment of the FinFET device 100C also includes two epi-layers 320/330 as its epitaxial structure, rather than three epi-layers 310/320/330 in the embodiment of the FinFET device 100A. The embodiment shown in FIGS. 9A-9B offer benefits when the fin structures 150 are made of silicon germanium, rather than crystal silicon. When the fin structures 150 are made of silicon germanium, the removal of the fin structures could result in reduced strain/stress, therefore adversely affecting mobility of the FinFET device. Here, the fin structures 150 are retained in the FinFET device 100C, and therefore its silicon germanium material composition could still maintain adequate strain/stress, and therefore mobility of the FinFET device is not adversely affected.

Figures 10A, 10B:
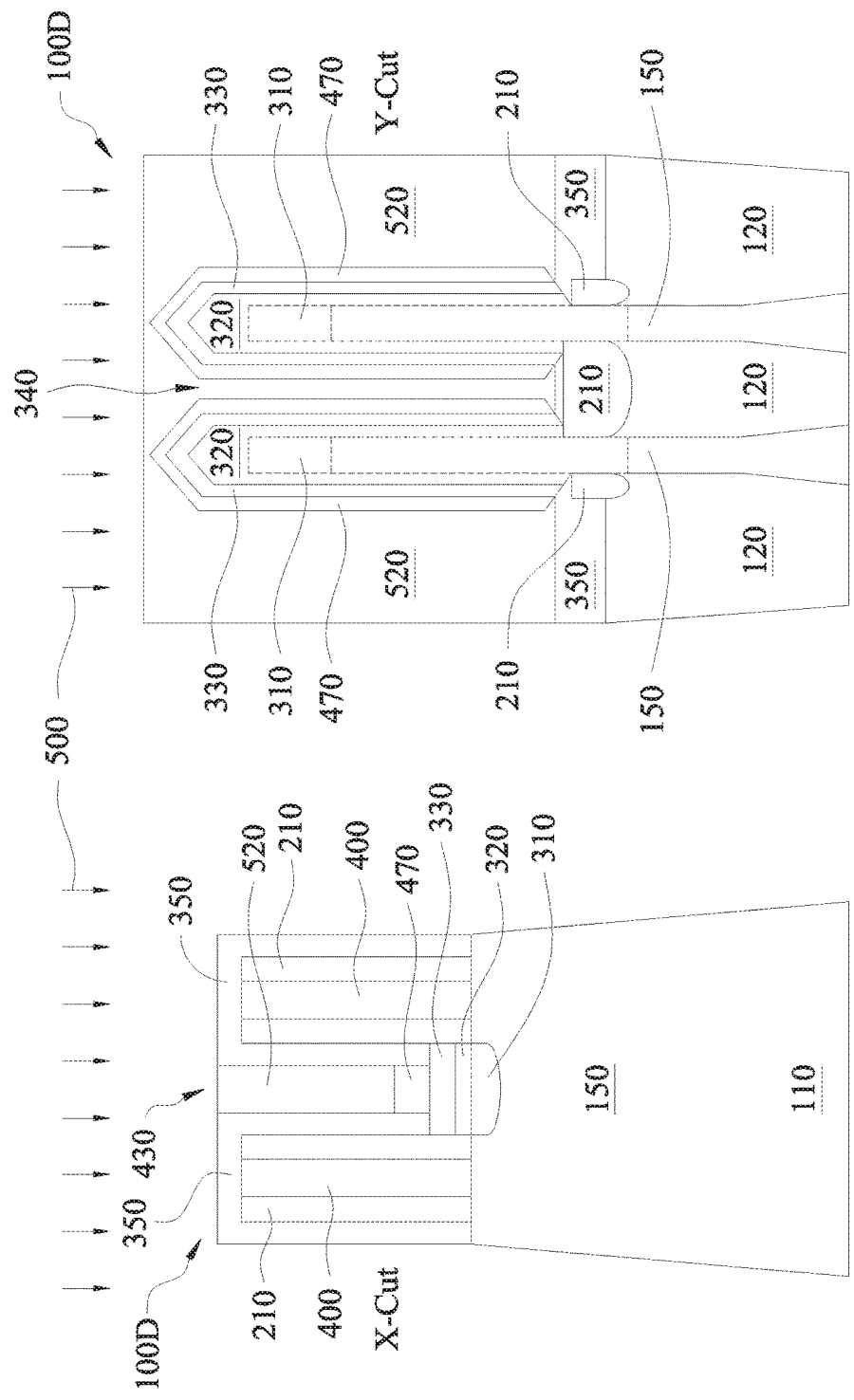

Referring now to FIGS. 10A-10B, another embodiment of the FinFET device 100D is illustrated. Compared to the embodiment of the FinFET device 100A shown in FIGS. 7A-7B, the embodiment shown in FIGS. 10A-10B does not fully replace the fin structures 150. Instead, the fin structures 150 are partially removed (for example, the upper segments of the fin structures 150 are removed). Thereafter, the epi-layer 310 is grown on the remaining segments of the fin structures 150. Compared to the embodiment corresponding to FIGS. 7A-7B, the embodiment shown in FIGS. 10A-10B has smaller epi-layers 310. For example, the epi-layer 310 in FIGS. 10A-10B is shorter in the Z-direction than the epi-layer 310 in FIGS. 7A-7B. Subsequently, the epi-layer 320 is grown on the epi-layer 310, as well as on side surfaces of the fin structures 150. The epi-layer 330 is then grown on the epi-layer 320, and the silicide layer 470 is formed on the outer surfaces of the epi-layer 330. In embodiments where the fin structures 150 are made of silicon, the presence of the epi-layer 310 still allows for device strain.

Referring now to FIGS. 11A-11B, another embodiment of the FinFET device 100E is illustrated. The embodiment shown in FIGS. 11A-11B has similarities with the embodiment shown in FIGS. 8A-8B in that no epi-layer 310 is formed. However, unlike the embodiment in FIGS. 8A-8B where the fin structures 150 extending out of the dielectric isolation structures 150 are fully removed, the fin structures 150 are partially removed in the embodiment shown in FIGS. 11A-11B. A substantial portion of the fin structures 150 still remain after the partial removal of the fin structures, and the epi-layer 320 is grown on the remaining portions of the fin structures 150, including on the top and side surfaces of the remaining portions of the fin structures 150. Subsequently, the epi-layer 330 is grown on the epi-layer 320, and the silicide layer 470 is formed on the outer surfaces of the epi-layer 330. In embodiments where the fin structures 150 are made of silicon, the presence of the epi-layer 320 still allows for device strain. In addition, since the epi-layer 320 is relatively heavy in germanium concentration, the embodiment of FIGS. 11A-11B may also offer improved device performance, because the epi-layer 320 occupies a significant volume of the epitaxial structures in this embodiment.

Figures 12A, 12B:
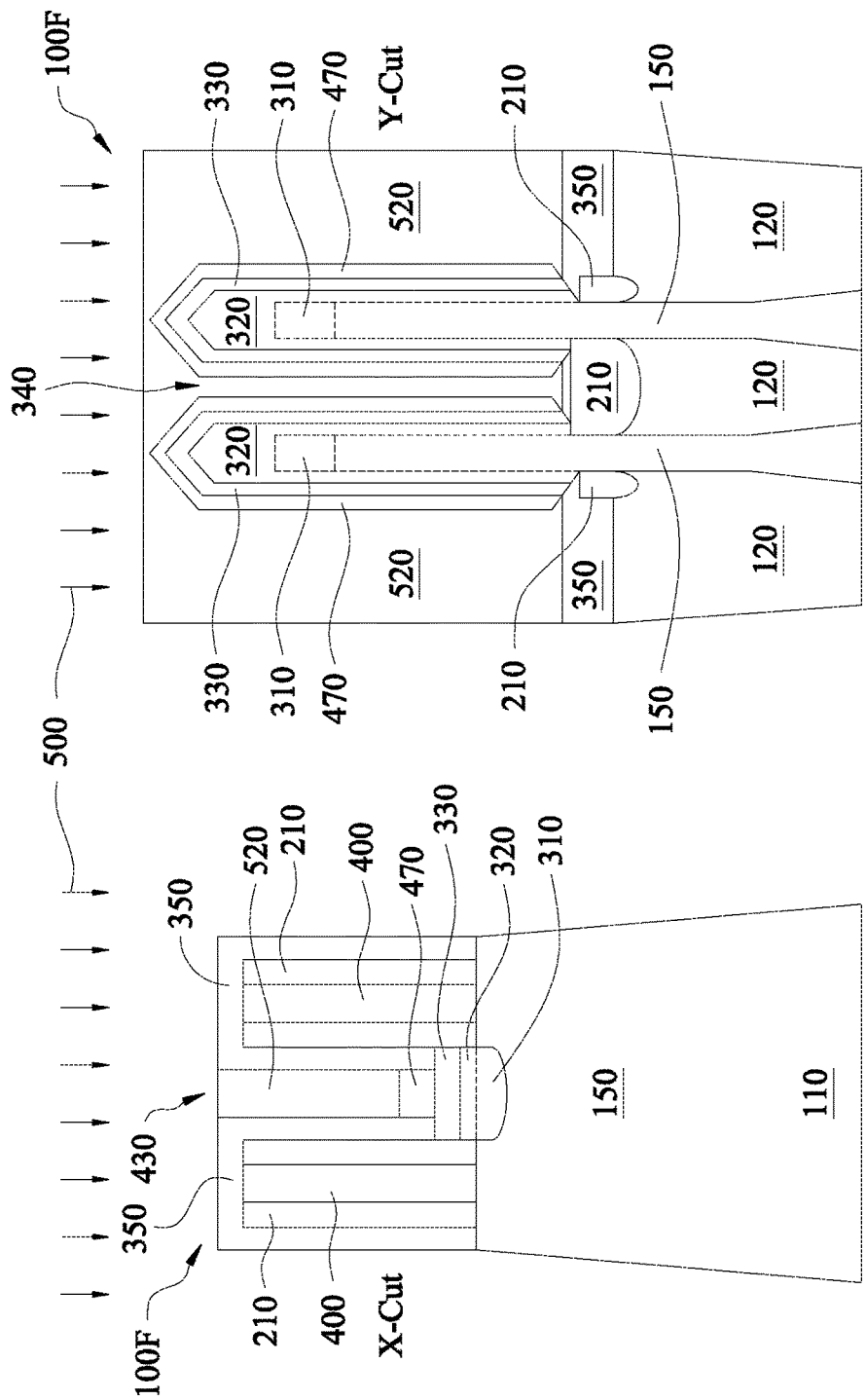

Referring now to FIGS. 12A-12B, another embodiment of the FinFET device 100F is illustrated. The embodiment shown in FIGS. 12A-12B has similarities with the embodiment shown in FIGS. 10A-10B in that the in structures 150 are not fully removed. Instead, the epi-layer 310 is grown on the remaining portions of the fin structures 150. However, the epi-layer 310 is smaller (e.g., a shorter dimension in the Z-direction) in the embodiment shown in FIGS. 12A-12B compared to the epi-layer 310 in the embodiment shown in FIGS. 10A-10B. Subsequently, the epi-layer 320 is grown on the top and side surfaces of the epi-layer 310, as well as on side surfaces of the remaining portions of the fin structures 150. The epi-layer 330 is then grown on the epi-layer 320, and the silicide layer 470 is formed on the outer surfaces of the epi-layer 330. The presence of the epi-layer 320 herein still allows for device strain. The epi-layer 310 also serves as a gradient layer to reduce lattice mismatch between the fin structures 150 (e.g., containing silicon) and the epi-layer 320 (a germanium-heavy silicon germanium layer). The reduction of lattice mismatch also helps improve device performance, since better quality epi-layers can be grown.

It is understood that in all of the embodiments discussed above, the epi-layer 330 may be grown on the epi-layer 320 in a conformal manner (e.g., having uniform or even thicknesses). In some embodiments, the growth of the silicide layer 470 and/or the epi-layer 320 may also be done in a conformal manner as well. The conformal growth of the layer(s) herein means that the dimensions for the epitaxial structures can be more accurately and precisely controlled, which improves device performance as well.

Figure 13:
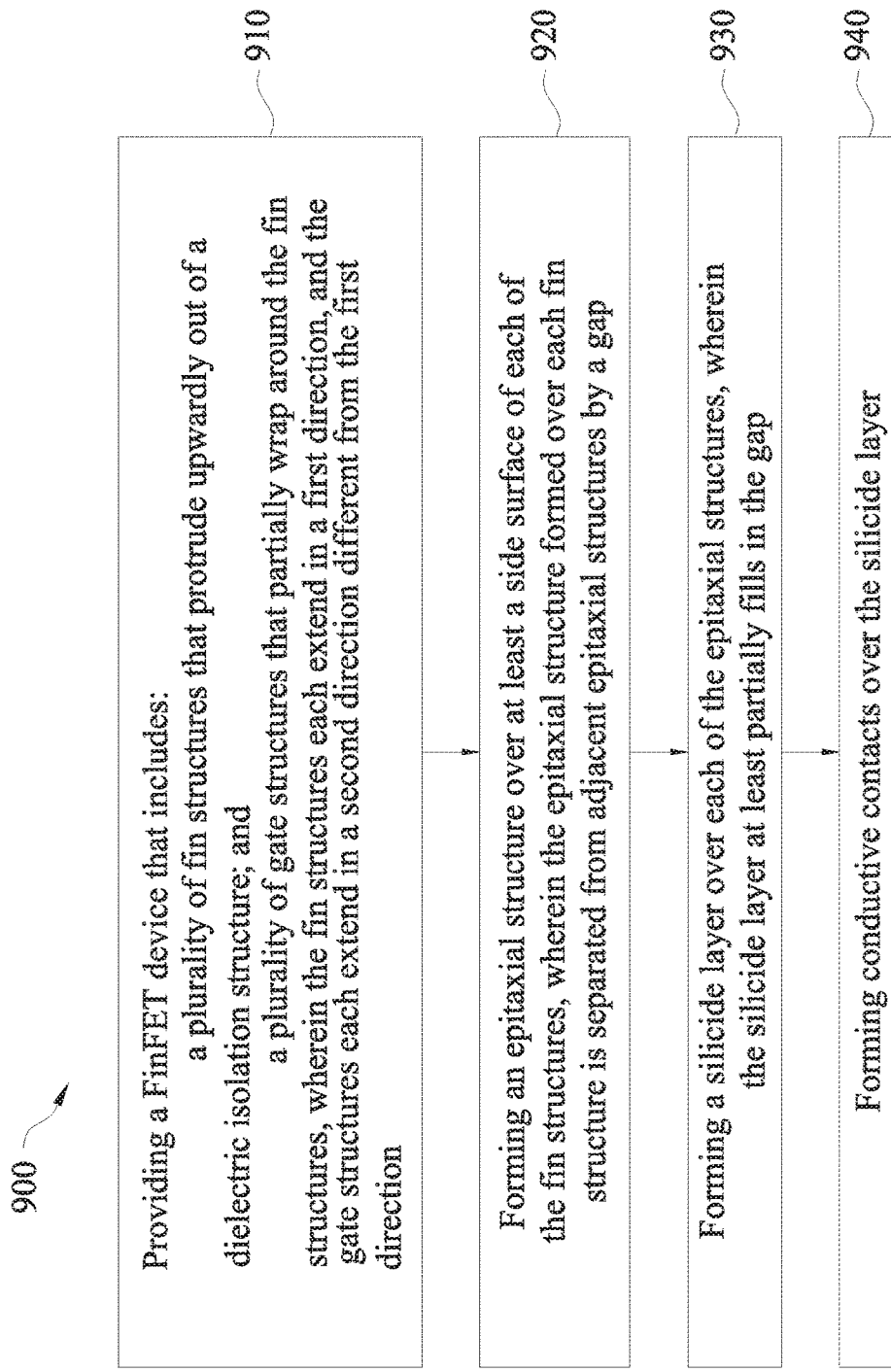
FIG. 13 is a flow chart of a method for fabricating a FinFET device in accordance with embodiments of the present disclosure.

FIG. 13 is a flowchart of a method 900 for fabricating a FinFET device in accordance with various aspects of the present disclosure. The method 900 includes a step 910 of providing a FinFET device. The FinFET device includes a plurality of fin structures that protrude upwardly out of a dielectric isolation structure. The FinFET device also includes a plurality of gate structures that partially wrap around the fin structures. The fin structures each extend in a first direction, and the gate structures each extend in a second direction different from the first direction.

The method 900 includes a step 920 of forming an epitaxial structure over at least a side surface of each of the fin structures. The epitaxial structure includes: a first epi-layer, a second epi-layer, or a third epi-layer. The epitaxial structure formed over each fin structure is separated from adjacent epitaxial structures by a gap.

The method 900 includes a step 930 of forming a silicide layer over each of the epitaxial structures. The silicide layer at least partially fills in the gap.

The method 900 includes a step 940 of forming conductive contacts over the silicide layer.

In some embodiments, the forming of the epitaxial structure comprises: removing the fin structures that protrude out of the dielectric isolation structure; growing the first epi-layer in place of the removed fin structures; growing the second epi-layer on the first epi-layer; and growing the third epi-layer on the second epi-layer, wherein the third epi-layer is separated from adjacent third epi-layers by the gap.

In some embodiments, the forming of the epitaxial structure comprises: removing the fin structures that protrude out of the dielectric isolation structure; growing the second epi-layer in place of the removed fin structures; and growing the third epi-layer on the second epi-layer, wherein the third epi-layer is separated from adjacent third epi-layers by the gap.

In some embodiments, the forming of the epitaxial structure comprises: growing the second epi-layer on each of the fin structures; and growing the third epi-layer on the second epi-layer, wherein the third epi-layer is separated from adjacent third epi-layers by the gap.

In some embodiments, the forming of the epitaxial structure comprises: partially removing the fin structures that protrude out of the dielectric isolation structure; growing the first epi-layer on remaining portions of the fin structures that are not removed; growing the second epi-layer on the first epi-layer and on the remaining portions of the fin structures; and growing the third epi-layer on the second epi-layer, wherein the third epi-layer is separated from adjacent third epi-layers by the gap.

In some embodiments, the forming of the epitaxial structure comprises: partially removing the fin structures that protrude out of the dielectric isolation structure; growing the second epi-layer on remaining portions of the fin structures that are not removed; and growing the third epi-layer on the second epi-layer and on the remaining portions of the fin structures, wherein the third epi-layer is separated from adjacent third epi-layers by the gap.

In some embodiments, the first epi-layer, the second epi-layer, and the third epi-layer each contain silicon germanium, and the second epi-layer has greater germanium content than the first epi-layer and the third epi-layer.

It is understood that additional process steps may be performed before, during, or after the steps 910-940 discussed above to complete the fabrication of the semiconductor device.

Based on the above discussions, it can be seen that the present disclosure offers advantages over conventional FinFET devices and the fabrication thereof. It is understood, however, that other embodiments may offer additional advantages, and not all advantages are necessarily disclosed herein, and that no particular advantage is required for all embodiments. One advantage is that by forming the epitaxial structures in a manner so as to not merge into each other, the subsequently formed silicide layer can be formed on a much greater surface area of the epitaxial structure. As a result, the silicide layer itself also has a much greater surface area for receiving the electrical contact. The contact resistance is therefore reduced significantly due to the larger silicide surface area. Another advantage is that the greater germanium content in the epitaxial structure (e.g., the epi-layer 320) allows for improved mobility and thus better device performance. Yet another advantage is that the fabrication processes herein allow for the epitaxial structure to have low epi-layer variation. For example, compared to conventional FinFET devices where the epi-layers are sometimes diamond-shaped, the epitaxial structures formed herein can be formed more similar to a bar or a rectangle, which can improve device performance. Other advantages include maintaining device strains, compatibility with existing fabrication process flows, etc.

One aspect of the present disclosure involves a method of fabricating a semiconductor device. A FinFET device is provided. The FinFET device includes a plurality of fin structures that protrude upwardly out of a dielectric isolation structure. The FinFET device also includes a plurality of gate structures that partially wrap around the fin structures. The fin structures each extend in a first direction, and the gate structures each extend in a second direction different from the first direction. An epitaxial structure is formed over at least a side surface of each of the fin structures. The epitaxial structure includes: a first epi-layer, a second epi-layer, or a third epi-layer. The epitaxial structure formed over each fin structure is separated from adjacent epitaxial structures by a gap. A silicide layer is formed over each of the epitaxial structures. The silicide layer at least partially fills in the gap. Conductive contacts are formed over the silicide layer.

Another aspect of the present disclosure involves a method of fabricating a semiconductor device. A first fin and a second fin are formed. The first and second fins each protrude vertically upwardly out of a dielectric isolation structure. A gate is formed. The gate partially wraps around the first fin and the second fin. The first fin and the second fin each extend in a first horizontal direction, and the gate extends in a second horizontal direction perpendicular to the first horizontal direction. A first epitaxial structure and a second epitaxial structure are formed, respectively, over a top surface and side surfaces of portions of the first fin and the second fin that are not wrapped around by the gate. The first epitaxial structure and the second epitaxial structure each includes: a first epi-layer, a second epi-layer, or a third epi-layer. The first epitaxial structure is spaced apart from the second epitaxial structures. A silicide material is formed over the first epitaxial structure and the second epitaxial structure. Portions of the silicide material are formed on side surfaces of the first epitaxial structure and the second epitaxial structure. A conductive material is formed on the silicide material.

Yet another aspect of the present disclosure involves a semiconductor device. The semiconductor device includes a plurality of fin structures that protrude vertically upward out of a dielectric isolation structure. The fin structures each extend in a first horizontal direction. A plurality of gate structures partially wrap around the fin structures. The gate structures each extend in a second horizontal direction different from the first horizontal direction. An epitaxial structure is formed on each of the fin structures. The epitaxial structure includes a first epi-layer, a second epi-layer, or a third epi-layer. The epitaxial structure formed over adjacent fin structures are not merged into each other. A silicide layer is formed on the epitaxial structure, including on side surfaces of the epitaxial structure between the adjacent fin structures. A conductive contact material is formed on the silicide layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
a first epitaxial structure;
a first silicide layer located on the first epitaxial structure;
a second epitaxial structure; and
a second silicide layer located on the second epitaxial structure;
wherein a gap separates the first silicide layer from the second silicide layer, and wherein the first epitaxial structure and the second epitaxial structure each comprise a first layer and a second layer.

2. The semiconductor device of claim 1, wherein the semiconductor device comprises one or more FinFET transistors.

3. The semiconductor device of claim 2, wherein the first epitaxial structure and the second epitaxial structure comprise source/drains of the one or more FinFET transistors.

4. The semiconductor device of claim 1, further comprising:
a first semi-conductive fin over which the first epitaxial structure is located;
a second semi-conductive fin over which the second epitaxial structure is located; and
a dielectric isolation structure located between the first semi-conductive fin and the second semi-conductive fin.

5. The semiconductor device of claim 4, further comprising: a gate located over the first semi-conductive fin and over the second semi-conductive fin.

6. The semiconductor device of claim 5, wherein the gate contains a high-k gate dielectric and a metal gate electrode.

7. The semiconductor device of claim 5, wherein:
the gate comprises an elongated structure that extends in a first direction; and
the first silicide layer is separated from the second silicide layer in the first direction.

8. The semiconductor device of claim 7, wherein the first semi-conductive fin and the second semi-conductive fin each extend in a second direction different from the first direction.

9. The semiconductor device of claim 1, wherein the first epitaxial structure and the second epitaxial structure each contain silicon germanium.

10. The semiconductor device of claim 9, wherein:
the first layer and the second layer have different germanium contents.

11. The semiconductor device of claim 10, wherein the second layer is located conformally on the first layer.

12. The semiconductor device of claim 1, further comprising: a metal-containing contact located on an upper surface and side surfaces of the first silicide layer and the second silicide layer.

13. A semiconductor device, comprising:
   a first epitaxial structure;
   a first silicide layer formed on an upper surface and side surfaces of the first epitaxial structure;
   a second epitaxial structure;
   a second silicide layer formed on an upper surface and side surfaces of the second epitaxial structure; and
   a metal component that is in direct contact with the first silicide layer and the second silicide layer, wherein at least a portion of the metal component is disposed between the first silicide layer and the second silicide layer;
   wherein the first epitaxial structure and the second epitaxial structure each include at least a first layer and a second layer, the first layer and the second layer having different material compositions.

14. The semiconductor device of claim 13, further comprising:
   a first semi-conductive fin over which the first epitaxial structure is located;
   a second semi-conductive fin over which the second epitaxial structure is located;
   a dielectric isolation structure disposed between the first semi-conductive fin and the second semi-conductive fin; and
   a high-k metal gate that partially wraps around the first semi-conductive fin and the second semi-conductive fin;
   wherein:
   the high-k metal gate extends in a first direction;
   the first semi-conductive fin and the second semi-conductive fin each extend in a second direction different from the first direction; and
   the portion of the metal component separates the first silicide layer from the second silicide layer in the first direction.

15. The semiconductor device of claim 13, wherein:
   the second layer is formed conformally on the first layer.

16. A method, comprising:
   forming a first semi-conductive fin and forming a second semi-conductive fin;
   epitaxially growing a first epitaxial structure over the first semi-conductive fin and epitaxially growing a second epitaxial structure over the second semi-conductive fin, wherein the first epitaxial structure and the second epitaxial structure are separated by a gap, wherein the epitaxially growing comprises epitaxially growing at least a first layer and a second layer that contains a different material than the first layer;
   forming a first silicide layer on the first epitaxial structure and forming a second silicide layer on the second epitaxial structure, wherein the first silicide layer and the second silicide layer partially reduce, but do not completely eliminate, the gap; and
   forming one or more conductive contacts over the first and second silicide layer, including in the gap.

17. The method of claim 16, wherein the first layer and the second layer have different germanium contents.

18. The method of claim 17, wherein the epitaxially growing comprises growing the second layer conformally on the first layer.

19. The method of claim 16, wherein:
   the first silicide layer is formed on an upper surface and side surfaces of the first epitaxial structure; and
   the second silicide layer is formed on an upper surface and side surfaces of the second epitaxial structure.

20. The method of claim 16, further comprising: forming an elongated gate structure over the first semi-conductive fin and the second semi-conductive fin, the elongated gate structure extending in a first direction, wherein the first epitaxial structure and the second epitaxial structure are separated in the first direction.

* * * * *